US007714659B2

(12) United States Patent
Leitner

(10) Patent No.: US 7,714,659 B2
(45) Date of Patent: May 11, 2010

(54) BIAS CIRCUIT WITH A FEEDBACK PATH AND A METHOD FOR PROVIDING A BIASING SIGNAL

(75) Inventor: Thomas Leitner, Pregarten (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/180,246

(22) Filed: Jul. 25, 2008

(65) Prior Publication Data
US 2010/0019852 A1 Jan. 28, 2010

(51) Int. Cl.
*H03F 3/04* (2006.01)
(52) U.S. Cl. .................. 330/296; 330/288
(58) Field of Classification Search ............... 330/285, 330/288, 296
See application file for complete search history.

(56) References Cited

U.S. PATENT DOCUMENTS 6,529,080 B1 * 3/2003 Seymour et al. ............ 330/296
6,778,016 B2 * 8/2004 Luo ........................... 330/296
6,842,075 B2 * 1/2005 Johnson et al. ............. 330/296
2007/0164824 A1 * 7/2007 Aoki .......................... 330/285

OTHER PUBLICATIONS

Taniguchi, E., et al., "Dual Bias Feed SiGe HBT Low Noise Linear Amplifier," IEEE 2001 Radio Frequency Integrated Circuits Symposium, Digest of Papers, May 20, 2001-May 22, 2001, 4 pages, IEEE.
Park, C., et al., "Dual mode Low Noise Amplifier for WCDMA applications," 2004 Conference, Department of E.E.E., 4 pages, Pohang University of Science and Technology (POSTECH), Pohang, Korea.

* cited by examiner

*Primary Examiner*—Khanh V Nguyen
(74) *Attorney, Agent, or Firm*—Slater & Matsil, L.L.P.

(57) ABSTRACT

Embodiments of the invention show a bias circuit for providing a biasing signal at a bias connection. The bias circuit includes a bias transistor and a feedback node, wherein the feedback node is coupled to a control terminal of the bias transistor via a first impedance element. The feedback node is furthermore coupled to the bias connection via a second impedance element. The control terminal of the bias transistor is coupled to the bias connection via a bypass-coupling path, which bypasses the first impedance element and the second impedance element, such that there is a feedback path via the bypass-coupling path and via the bias transistor from the bias connection to the feedback node.

25 Claims, 12 Drawing Sheets

| | | Comparison at 2140 MHz<br>Bias circuit without feedback path to<br>Bias circuit with feedback path |
|---|---|---|
| Icc | mA | 3,3 |
| S21 | dB | 16,5 |
| S11 | dB | -12 |
| S22 | dB | -22,0 |
| NF | dB | 1,1 |
| ΔIIP3 | dBm | +5,7 |
| ΔP1dB | dBm | +3,8 |

FIG 6

BIAS CIRCUIT WITH A FEEDBACK PATH AND A METHOD FOR PROVIDING A BIASING SIGNAL

BACKGROUND

A bias circuit can be used for adjusting the operating point of an amplifier. Such a bias circuit can be formed as a current mirror circuit, for example, which biases the control terminal of an amplifier transistor. For a low noise amplifier, for example, it is desirable to reduce the noise from a bias circuit in order to ensure a high-quality performance of the low noise amplifier (LNA) with respect to important parameters or device parameters, e.g., the linearity of the amplifier, the compression point (P1dB) or the intermodulation point (IP3). The linearity of an amplifier, the compression point and the intermodulation point are determined among others by the bias current of an amplifier transistor and the way how the bias circuit, which delivers the bias current, is implemented. Such low noise amplifiers can, for example, be used in global positioning systems (GPS), wireless or mobile phone applications and in automotive applications of the bias circuit.

Conventionally, the noise of the bias circuit, for example, the noise of a current mirror transistor of the bias circuit, is blocked by a high-ohmic impedance.

SUMMARY OF THE INVENTION

Some embodiments according to the invention relate to a bias circuit. Some embodiments relate to a bias circuit with a feedback path for a low noise amplifier and to a method for providing a biasing signal.

BRIEF DESCRIPTION OF THE DRAWINGS

FIG. 6 shows a table, which compares important amplifier parameters of amplifiers with a modified bias circuit comprising a feedback path according to an embodiment of the invention and with a bias circuit without a feedback path;

DETAILED DESCRIPTION OF ILLUSTRATIVE EMBODIMENTS

With reference to FIGS. 1 to 9, embodiments are depicted, which relate to a bias circuit with a feedback path for providing a biasing signal at a bias connection, to an amplifier and to a method for providing a biasing signal at a bias connection of a bias circuit.

Figure 1:
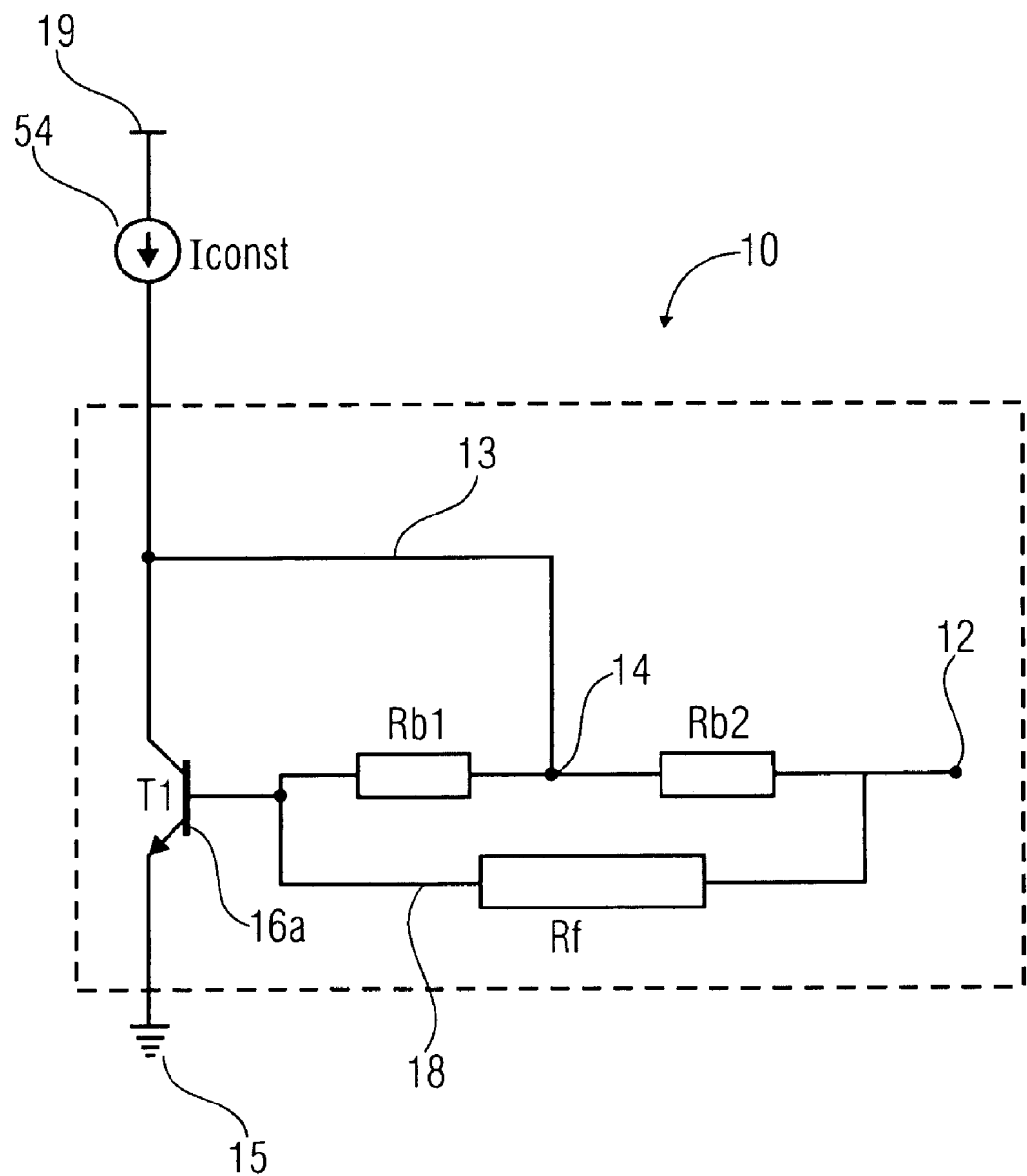
FIG. 1 shows a schematic diagram of a bias circuit with a feedback path according to an embodiment of the invention.

In FIG. 1, a schematic diagram of a bias circuit according to an embodiment of the invention is shown. The bias circuit 10 for providing a biasing signal at a bias connection 12 comprises a bias transistor T1 and a feedback node 14. The feedback node 14 is coupled to a control terminal 16a of the bias transistor T1 via a first impedance element Rb1. In this embodiment, the feedback node 14 is furthermore coupled to the bias connection 12 via a second impedance element Rb2. The control terminal 16a of the bias transistor T1 is coupled to the bias connection 12 via a bypass-coupling path 18, which bypasses the first impedance element Rb1 and the second impedance element Rb2 such that there is a feedback path, via the bypass-coupling path 18 and via the bias transistor T1, from the bias connection 12 to the feedback node 14. The bias circuit 10 may be connected to a reference potential feed 15 and to a supply potential feed 19. A current source 54 may supply the required current for the bias circuit 10. The bypass-coupling path 18 may comprise a feedback impedance element Rf, which may, for example, be of the same type as the first impedance element Rb1 and the second impedance element Rb2. For example, the feedback impedance element Rf may be a resistor with a certain resistance value.

The bias circuit shown in FIG. 1 comprises a bypass-coupling path 18 with a feedback impedance element Rf, so that a coupling via the feedback path to the feedback node 14 is stronger for a low frequency signal, which is applied at the bias connection 12 than for a high frequency signal, which may be applied at the bias connection 12. The feedback path may extend via the bypass-coupling path 18, the bias transistor T1 and the connection 13, wherein the connection 13 couples a terminal of the controllable conductive path of the bias transistor T1 to the feedback node 14.

The input impedance of the bias circuit 10 viewed from the bias connection 12 can be reduced compared to a bias circuit without the bypassing coupling path 18, for a DC signal or a low frequency signal, which may be coupled to the bias connection 12.

The input impedance of the bias circuit is reduced by the feedback in the feedback path for low frequency signals applied at the bias connection 12. A low frequency input signal coupled to the bias connection 12 is coupled via the bypass-coupling path 18, which is comprising the feedback impedance element Rf, to the control terminal 16a of the bias transistor T1. As a consequence, a current in the controllable path of the transistor T1 is increased in response to a positive voltage change at the bias connection 12. Consequently a potential at the feedback node 14 is decreased, so that for low frequencies, the input impedance viewed from the bias connection is reduced. For high frequency input signals, which may be coupled to the bias connection 12, the (parasitic) capacitance of the bias transistor T1, for example, the base collector capacitance of the bias transistor T1, acts as a kind of low pass, so that a potential at the feedback node 14 is almost unchanged by the high frequency input signal. As a consequence, the input impedance of the bias circuit for the high frequency signal is approximately given by the second impedance element Rb2.

The bias transistor T1 can be a bipolar junction transistor (BJT), for example. The bias transistor can be an npn-bipolar transistor or a pnp-bipolar transistor, for example.

In some embodiments of the invention, the feedback path may optionally be configured such that an input impedance of the bias circuit 10, viewed from the bias connection, is at least by a factor of two higher at a desired frequency-of-operation range than in a frequency range lower than the desired frequency-of-operation range.

The bias circuit 10 may optionally be configured such that the input impedance of the bias circuit, viewed from the bias connection 12, differs from an impedance value of the second impedance element Rb2 by less than about 30% in the desired frequency-of-operation range, and such that the input impedance is at least about 50% lower than the impedance value of the second impedance element for a frequency lower than the desired frequency-of-operation range. The desired frequency-of-operation may be given by the operating frequency range of an amplifier biased by the bias circuit 10.

In some embodiments of the invention, the first impedance element Rb1 and the second impedance element Rb2, as well as the feedback impedance element Rf in the bypass-coupling path 18 may optionally be formed as a resistor. The impedance value of the feedback impedance element Rf may, for example, be at least twice the impedance value of the second impedance element Rb2. The impedance value of the first impedance element may, for example, be at least about 1.5 times higher than the impedance value of the second impedance element Rb2.

The feedback in the feedback path may, for example, result in a reduction of the input impedance of the bias circuit for low frequencies, wherein the high-impedance or high-resistance blocking behavior in a desired frequency of operation range may be almost not reduced. This reduction of the input impedance of the bias circuit, viewed from the bias connection, results in an improved compression behavior and an improved intermodulation behavior of an amplifier, which may be biased by the bias circuit 10 according to an embodiment of the invention.

The feedback path from bias connection 12 to the feedback node 14 can be formed, such that the control terminal 16a of the bias transistor T1 is coupled to the bias connection 12 via the bypass-coupling path 18. For a given frequency below a desired frequency-of-operation range, a voltage signal at the feedback node 14, which is caused by a voltage signal at the bias connection 12, may be opposite in phase to the voltage signal at the bias connection 12. In other words, the feedback in the feedback path can be a negative feedback for a given frequency below the desired frequency-of-operation range of the bias circuit.

The bias circuit may, in a frequency selective way, be configured to provide a negative feedback signal to the feedback node 14 in response to a signal at the bias connection 12 in order to reduce, for a given frequency range, an effective impedance of the second impedance element. In order to achieve such a frequency selective negative feedback, the bias circuit 10 may comprise a low pass element, which can, for example, be formed by the bias transistor T1 and the inherent base-collector capacitance. It is also, optionally possible that the bias circuit comprises a capacitive element, coupled in parallel to the controllable conductive path of the bias transistor T1, to obtain a low pass characteristic of the feedback path. Depending on the capacitance value of the capacitive element, such a low pass characteristic of the feedback path can be tuned, so that the input impedance of the bias circuit can be reduced in a frequency range below the desired frequency-of-operation range.

The feedback path of the bias circuit may also comprise a low pass filter configured to determine a boundary frequency or a cut-off frequency for reducing the input impedance of the bias circuit for frequencies below a desired operating frequency range.

Figure 2:
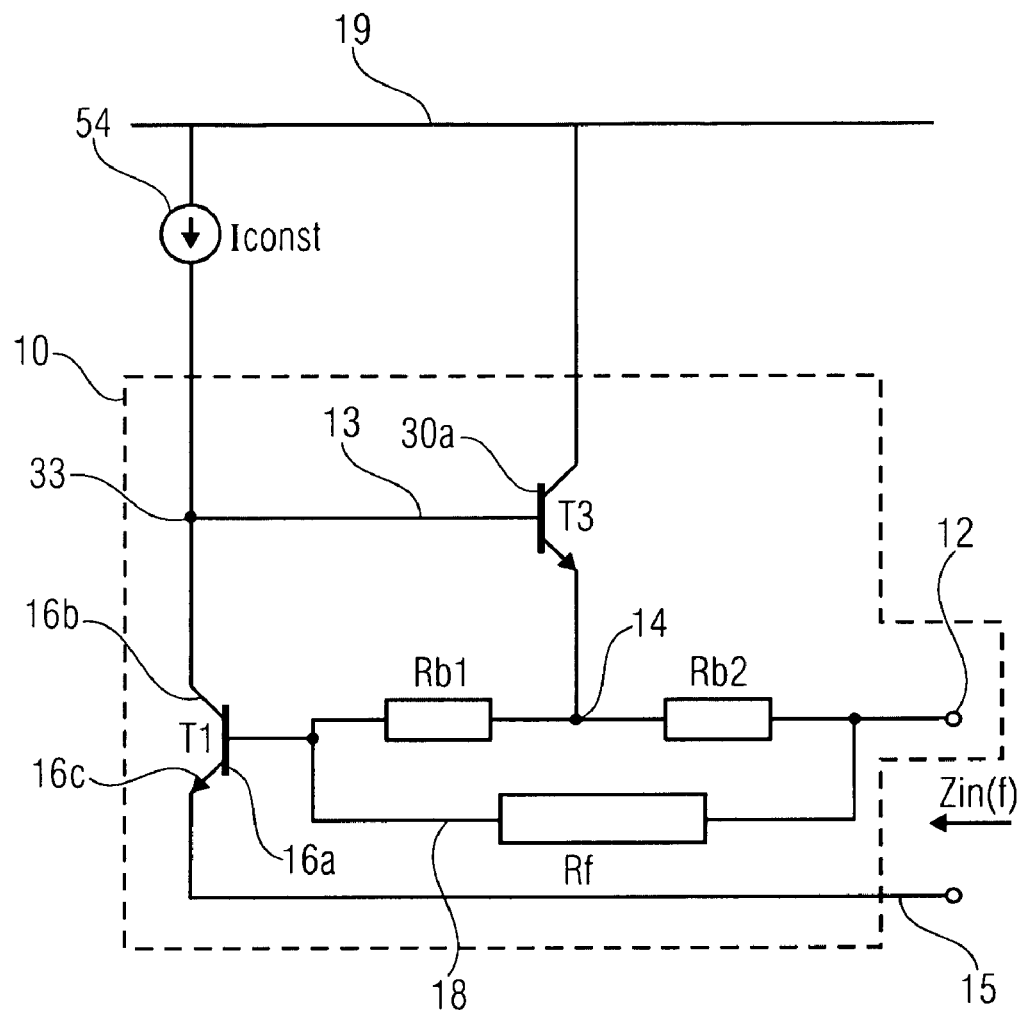
FIG. 2 shows a schematic diagram of a bias circuit according to an embodiment of the invention.

In FIG. 2, another embodiment of the invention is depicted. In this embodiment, the bias circuit 10 provides a biasing signal at a bias connection 12. The bias circuit 10 comprises a bias transistor T1 and a feedback node 14. Furthermore, the bias circuit comprises a first impedance element Rb1 and a second impedance element Rb2, wherein the feedback node 14 is coupled, via the first impedance element Rb1, to a control terminal 16a of the bias transistor T1 and, via the second impedance element Rb2, to the bias connection 12. The control terminal 16a of the bias transistor is furthermore coupled to the bias connection 12 via a bypass-coupling path 18, wherein the bypass-coupling path comprises a feedback impedance element Rf. The bypass-coupling path bypasses the first impedance element Rb1 and the second impedance element Rb2, such that there is a feedback path via the bypass-coupling path 18 and via the bias transistor T1 from the bias connection 12 to the feedback node 14. In this embodiment, the bias circuit comprises a support transistor T3, for example, a bipolar transistor. The controllable conductive path of the support transistor T3 is connected to the feedback node 14, and the control terminal 30a of the support transistor T3 is connected to a terminal of the controllable conductive path of the bias transistor T1. The support transistor T3 is configured to contribute to a coupling between the bias connection 12 and the feedback node 14. As it is shown in FIG. 2, a constant current source 54 may be connected, via a node 33, to the control terminal of the support transistor T3 and to a terminal of the controllable conductive path of the bias transistor T1, for example to a collector terminal 16b of the transistor T1. The second terminal 16c of the controllable conductive path of the bias transistor T1, for example, the emitter-terminal is coupled to a reference potential feed 15. The reference potential feed 15 may be a ground potential. The current source 54 and the second terminal of the controllable conductive path of the support transistor T3, for example, the collector-terminal of the support transistor T3, may be coupled to a supply potential feed 19.

The support transistor T3 can be configured to contribute to a coupling between the bias connection and the feedback node. That means, for example, that the input impedance of the bias circuit, viewed from the bias connection 12, can be strongly reduced for a given frequency below the desired frequency-of-operation range by the operation of the support transistor T3. The support transistor T3 may act as an emitter-follower to provide a low impedance at the feedback node 14.

Figure 3:
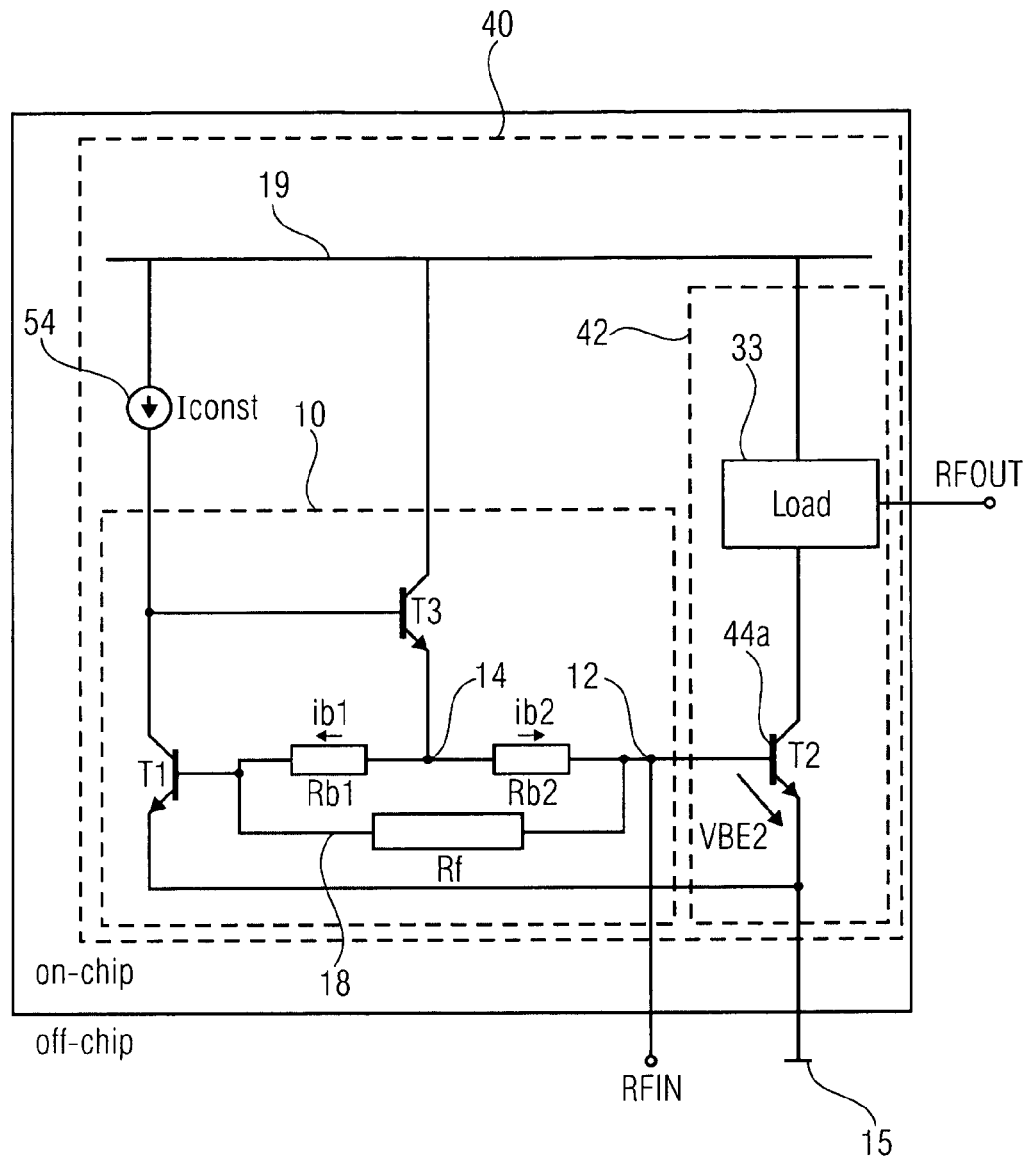
FIG. 3 shows a schematic diagram of a low noise amplifier comprising a bias circuit with a feedback path according to another embodiment of the invention.

In FIG. 3, an amplifier 40 is shown, which is biased using a bias circuit 10 according to another embodiment of the invention. The amplifier 40 may be monolithically integrated on one chip. The amplifier 40 may comprise an amplifier unit or gain unit 42, a constant current source 54 Iconst and a bias circuit 10 for providing a biasing signal at a bias connection 12. The amplifier 40 may be configured, for example, to amplify a high frequency (HF) signal or radio frequency (RF) signal, which may be provided, for example, by an antenna, or the like, at a high frequency input terminal RFIN. The amplified high frequency signal can be forwarded via a load matching circuit 33 to an output terminal RFOUT of the amplifier. The amplifier unit 42 may comprise an amplifier transistor T2, wherein a control terminal 44a, for example, a base terminal of the amplifier transistor T2 is connected to the bias connection 12 of the bias circuit 10. This means that the amplifier transistor T2 is biased using the bias circuit 10. The bias circuit 10 may be formed as described in context with the description of FIGS. 1 and 2. Accordingly the bias circuit may comprise a bias transistor T1, a first impedance element Rb1 and a second impedance element Rb2. A feedback node 14 of the bias circuit is coupled to the bias connection 12 via a feedback path. The feedback path extends via the support transistor T3, the bias transistor T1 and the bypass-coupling path 18, which is comprising the feedback impedance element Rf. Both the bias connection 12 and an input terminal RFIN of the amplifier may be coupled to an input node of the amplifying unit 42. The input node may be the control terminal 44a of the amplifier transistor T2. Thus, the bias circuit 10 provides a bias signal to the input node of the amplifying unit to bias the amplifying unit. The bias signal is combined with an amplifier input signal obtained from the input terminal RFIN. In the above described configuration the amplifier input signal to be amplified is fed to the bias connection.

According to an embodiment of the invention, an effective input impedance of the amplifier for a signal to be amplified is determined both by the input impedance of the bias circuit and by the input impedance of the amplifying unit 42. The amplifying unit 42 is configured to provide an amplified output signal based on an input signal applied to the RFIN input terminal. The signal, which is applied to the input terminal RFIN, may be the signal to be amplified. The signal to be amplified may comprise a frequency in a desired frequency-of-operation range.

The bias circuit 10 may be configured to set a certain operating point for the amplifier transistor T2. The bias circuit 10 may furthermore be configured to stabilize the operating point of the amplifier transistor. In some cases, the bias circuit 10 may cause an improved compression behavior and an improved intermodulation behavior compared to conventional low noise amplifiers, without feedback path.

In the embodiment depicted in FIG. 3, a dependence of the base-emitter voltage VBE2 of the amplifier transistor T2 from the resistor Rb2 is reduced by means of the feedback in the feedback path with the resistor Rf. A high-resistance blocking or high-impedance blocking of high frequency input signals comprising a desired frequency-of-operation is hardly reduced or not reduced significantly.

The dependence of the base emitter-voltage VBE2 from the second impedance element Rb2 can be described by the formula (1):

$$VBE2 = V_t \cdot \ln\left(\frac{I_{const} \cdot \beta \cdot (\beta+1)}{N1 \cdot I_S \cdot (\beta \cdot (\beta+1) + \left(1 + \frac{N2}{N1} + \frac{\Delta ib2}{ib1}\right))}\right) - Rb2 \cdot \frac{R_f}{Rb1 + Rf} \cdot \Delta ib2 \quad (1)$$

For this formula it is assumed that all transistors comprise the same current amplification β and the same saturation current $I_S$, in order to simplify the analysis. A change of the base current of the transistor T2, because of an excursion is represented in formula (1) with Δib2. The currents ib2 and ib1 represent the current flow through the respective resistors Rb1 and Rb2. The current of the current mirror circuit for the currents ib1 and ib2 can be described by the relation ib1·N2=ib2·N1. The relation of the resistors Rb1 and Rb2 satisfies the formula Rb2·N2=Rb1·N1. $V_t$ corresponds to kT/q. For a desired operation frequency, a certain input impedance of the low noise amplifier is desired in order to block the noise of the transistor T1. Therefore, a resistance value of the resistor Rb2 should not be chosen as small as desired. As it can be seen from formula (1), the dependence of the base emitter voltage VBE2 of the amplifier transistor T2 from the resistor Rb2 can be reduced by means of the feedback using the feedback impedance element Rf. As a consequence, an improved compression behavior of the amplifier 40, e.g., the low noise amplifier 40, can be achieved in some cases. In other words, the bypass feedback path comprising the impedance element Rf may comprise the effect to counteract a reduction of the base-emitter voltage of the amplifier transistor T2 in the presence of a strong radio frequency (RF) input signal at the terminal RFIN.

The VBE2 dependence from the resistor Rb2 for an amplifier without the bypass-coupling path can be analytically described with the following formula (2):

$$VBE2 = V_t \cdot \ln\left(\frac{I_{const} \cdot \beta \cdot (\beta+1)}{N1 \cdot I_S \cdot (\beta \cdot (\beta+1) + \left(1 + \frac{N2}{N1} + \frac{\Delta ib2}{ib1}\right))}\right) - Rb2 \cdot \Delta ib2 \quad (2)$$

Furthermore, the intermodulation behavior of the amplifier 40 may be improved in some cases, as the following considerations will reveal. For the intermodulation behavior a source impedance Zs, for example, the input impedance (for example, at the input node) at a frequency ±n·f1±m·f2 may be important, wherein n and m are between 1 . . . N and wherein f1 and f2 may be designated to two frequencies of two signals. A first input signal of the amplifier 40 may comprise a frequency f1, which may be heterodyned by a second signal with a frequency f2, so that distortions caused by an intermodulation of the two signals may occur at the output of the amplifier 40. This can occur, since the amplifier may comprise, at a certain frequency, a non-linear characteristic. Therefore, mixed products of the two frequencies may occur in the amplification range of the amplifier. The intermodulation behavior of a certain order depends on the integer numbers n and m. For the third order intercept point (IP3), the source impedance Zs at a frequency |f-f2| is an important criterion. The difference frequency |f1−f2| is often about 1 MHz. In order to keep the source impedance at a frequency |f1−f2| as low as possible, a low frequency sink may be used in a matching network.

The input impedance for a bias circuit without the bypass-coupling path can be described for low frequencies by the following formula (3):

$$Zin = Rb2 \text{ for } f \ll \quad (3)$$

The bias circuit with the bypass-coupling path, which is depicted in FIG. 3, comprises a frequency-dependent input impedance. For a low frequency signal, the input impedance Zin can be approximately described using the following formula (4):

$$Zin = \frac{Rb2 \cdot Rf}{Rb1 + Rb2 + Rf} \text{ for } f \ll \quad (4)$$

According to embodiments of the invention, the input impedance Zin for low frequencies can be reduced compared to the input impedance of the conventional bias circuit, which is described by the formula (3), by the bypass-coupling path comprising the feedback impedance element Rf.

Figure 4:
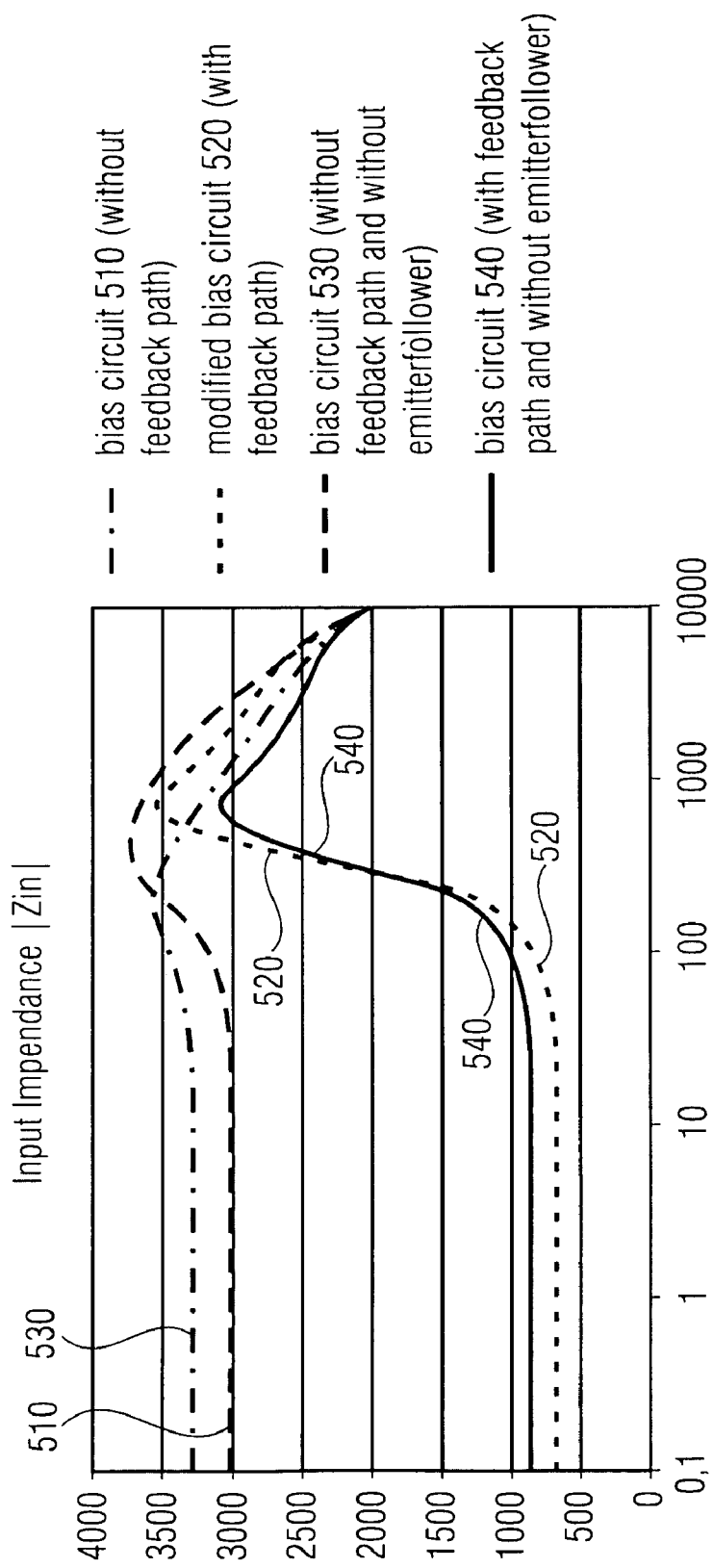
FIG. 4 shows a diagram representation of the input impedance for different bias circuitry in dependence of the frequency of an input signal.

FIG. 4 shows a diagram representing simulation results for the input impedance of bias circuits. The diagram comprises four curves, wherein curve 510 belongs to a bias circuit without feedback path, wherein a curve 520 belongs to a modified bias circuit with feedback path, wherein a curve 530 belongs to a bias circuit without a feedback path and without an emitter follower support transistor T3 and wherein curve 540 belongs to a modified bias circuit without the emitter follower T3. On the logarithmic abscissa the frequency in MHz is depicted. A magnitude of the input impedance |Zin| of the bias circuit is assigned to the Y-axis. The simulation results shown in FIG. 4 have been achieved with the Infineon B7HFM technology. The resistance values of the first impedance element Rb1, the second impedance element Rb2 and the feedback impedance element Rf are: Rb1=42 kΩ, Rb2=3 kΩ and Rf=13 kΩ (curves 520, 540 only). The simulation clearly reveals the above-described reduction of the input impedance of the bias circuit with feedback, illustrated by the curves 540 and 520. The reduction of the input impedance |Zin| for low frequencies results in an improvement of the third order intercept point (IP3) on the input side compared to the smaller reduction of the input impedance by means of only the two resistors Rb1, Rb2 as in a bias circuit without the feedback path. A similar result may be achieved using a low frequency sink. The small reduction of the input impedance for the modified bias circuit with the emitter follower and for the modified bias circuit without the emitter follower, for higher frequencies can optionally be counteracted or avoided by an increase of the resistance values of the resistors Rb1 and Rb2. The boundary frequency or the cut-off frequency for the reduction of the input impedance caused by the feedback in the feedback path depends, among others, on the base-collector capacitance of the current mirror transistor T1 (see FIG. 3). By means of a capacitive element, this boundary frequency or cut-off frequency can be shifted to lower frequencies. That means that the bias circuit can optionally comprise a capacitive element 75 (see FIG. 5) coupled in parallel to the controllable conductive path of the bias transistor T1 to obtain a low pass characteristic of the feedback path, such that the boundary frequency for reducing the input impedance of the bias circuit below a desired operating frequency is given. For example, by forming a low pass element using a capacitive element, which is coupled in parallel to the conductive controllable path of the mirror transistor T1, a certain boundary frequency or cut-off frequency can be achieved. If the boundary frequency is shifted to the frequency range of |f1–f2|, the input impedance Zin(|f1–f2|) increases and the achieved improvement in terms of the intermodulation behavior may be reduced.

The frequency dependent behavior of the input impedance of the bias circuit according to an embodiment of the invention can also be observed if the support transistor T3, which contributes to the amplification, for example, of the current mirror and of the feedback path from the bias connection to the feedback node, is missing in the bias circuit. However, the observed effect of an input impedance reduction is, in this case, less than with the support transistor T3, as can be seen in FIG. 4 (compare curve 540 and curve 520).

According to some embodiments of the invention, the bias circuit with the bias transistor T1 can optionally be configured to form a current mirror together with the amplifier transistor T2, which may be connected to the bias connection.

In some embodiments the bias circuit with the feedback path may be configured so that the input impedance differs from an impedance value of the second impedance element by less than about 30% at a desired frequency-of-operation range, and such that the input impedance is at least about 50% lower than the impedance value of the second impedance element, at a frequency range lower than the desired frequency-of-operation range.

Figure 5:
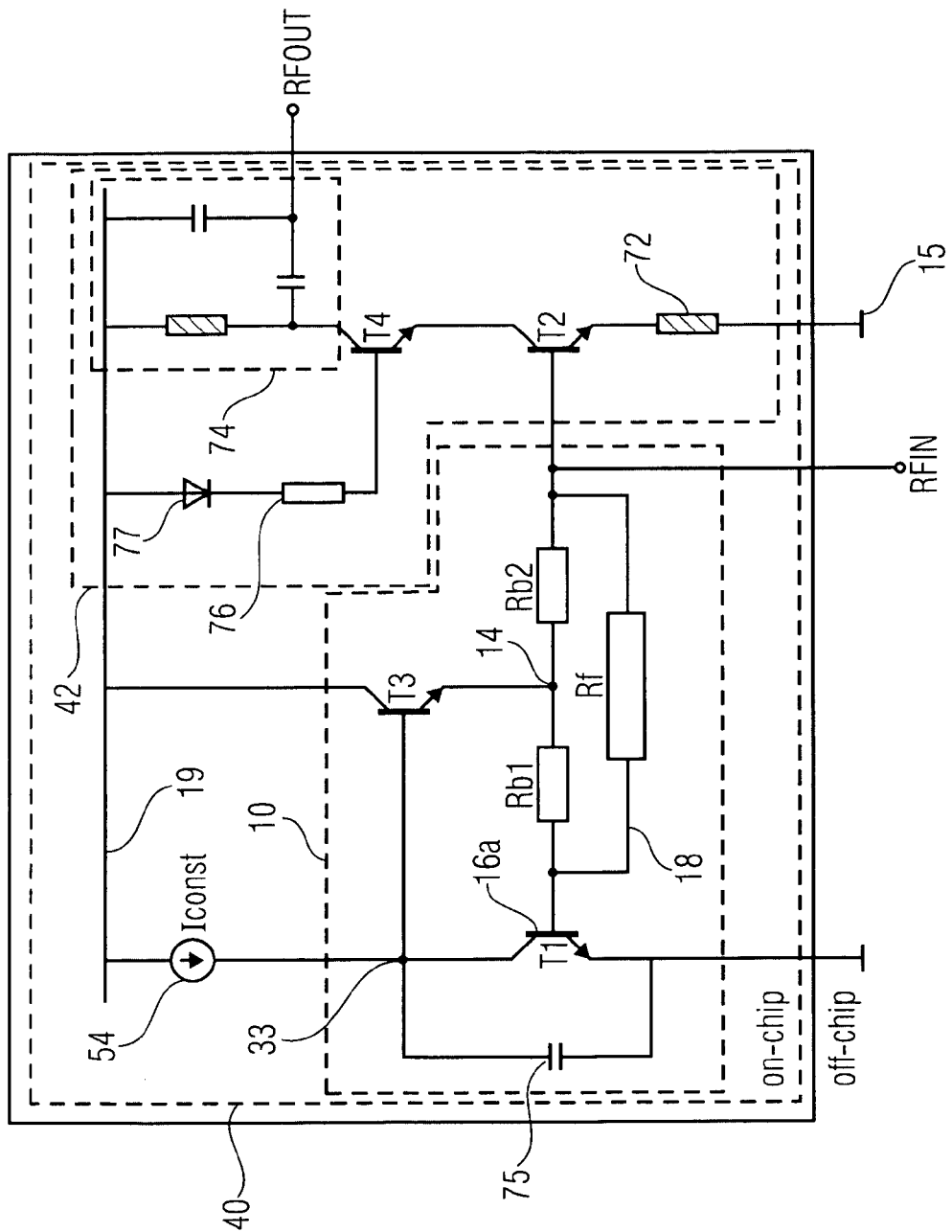
FIG. 5 shows a schematic diagram of an amplifier with a pair of cascode transistors coupled to a bias circuit with a feedback path, according to an embodiment of the invention.

FIG. 5 shows a schematic diagram of an amplifier 40 with an amplifier unit 42 and a bias circuit 10, according to another embodiment of the invention. The amplifier 40 comprises an input signal terminal RFIN and an output terminal RFOUT. In this embodiment, the amplifying unit 42 comprises a pair of transistors T2 and T4, which are coupled in a cascode configuration, wherein the bias circuit 10 is configured to bias the control terminal of the amplifier transistor T2. One terminal of the amplifier transistor T2, for example, an emitter terminal of the amplifier transistor T2, is coupled to the reference potential feed 15 via an inductor 72. The amplifier transistor T2 is coupled, via the cascode transistor T4 and an output stage 74, to the output terminal RFOUT of the amplifier. The output stage 74 may be coupled to the supply potential feed 19 and may be configured to provide an output matching. The diode 77 in series with the resistor 76 may also be coupled to the supply potential feed 19 and may be configured to provide a bias signal for adjusting the operation point of the transistor T4.

The bias circuit 10 may comprise a bias transistor T1, wherein the control terminal 16a of the bias transistor is coupled, via a bypass-coupling path 18 comprising a feedback impedance element Rf, to the bias connection 12, which is connected to the control terminal of the amplifier transistor T2. The RFIN input and the bias connection are both coupled to the control terminal of the amplifier transistor T2. Accordingly a portion of the RF input signal from the RFIN connection of the amplifier may be coupled into the bias circuit, while the rest of the RF input signal may be coupled to the amplifier transistor T2. The capacitive element 75 may be connected in parallel to the two terminals of the controllable conductive path of the bias transistor T1. The amplifier 40 comprises a support transistor T3, which is coupled to the bias transistor T1 and the feedback node 14 in order to amplify the coupling or to contribute to the coupling from the bias connection to the feedback node. The feedback node 14 is coupled to the control terminal of the bias transistor via the first impedance element Rb1 and is coupled to the bias connection 12 via the second impedance element Rb2. In this embodiment the first impedance element, the second impedance element and the feedback impedance element are resistors. The amplifier 14 may further comprise a constant current source 54. The constant current source can be connected to the control terminal of the support transistor T3 and to a controllable-conductive path terminal, for example, the collector terminal, of the bias transistor T1. The bias circuit 10 may be configured to adjust or regulate the potential at the feedback node, so that a dominant portion, for example, at least about 90%, of the current delivered by the current source 54 flows through the controllable conductive path of the bias transistor T1. Thus, the potential at the feedback node is adjusted in response to the current provided by the current source.

It should be noted here that the current source 54 may be replaced by an adjustable current source in some embodiments, for example, to adjust an amplification.

An effect of the modified bias circuit according to embodiments of the invention is the fact that the impedance for the desired frequency-of-operation range of the amplifier can be relatively high, for example, larger than 1 kΩ or almost unchanged, when compared to a bias circuit without feedback. The impedance for lower frequencies, for example, for a frequency |f1–f2|, for example, of the order of 1 MHz can be brought to a relatively low value, for example, smaller than 1 kΩ or reduced, when compared to a bias circuit without feedback. Therefore, the intermodulation behavior, for example, the IP3, can be improved without a significant worsening of the noise figure or the S21-parameter of the amplifier. The compression behavior depends on the DC-bias impedance. The smaller the DC-bias impedance, the less it counteracts with the input impedance of the bias circuit and the amplification of the low noise amplifier. Therefore, the compression point is increased. If a high input level is applied at the low noise amplifier transistor T2, the base current of the amplifier transistor is increased. The bias circuit 10 can supply this additional base current. As a consequence, an additional voltage drop in dependence of the bias circuit impedance may occur, such that the voltage between the base and the emitter VBE2 of the amplifier transistor T2 depends on the bias impedance.

In this embodiment, the input of the amplifying unit 42 may be formed by a control terminal of an amplifying transistor T2. The control terminal of the amplifying transistor can be coupled to the bias transistor T1, such that a current mirror is formed. The current mirror may counteract a reduction of the voltage at the control terminal of the amplifying transistor T2 using the bypass-coupling path 18.

FIG. 6 shows a table of important performance parameters of the amplifier 40 described with reference to FIG. 5 and of an amplifier comparable to the amplifier 40 depicted in FIG. 5, but without the feedback path. The table in FIG. 6 shows a comparison of the collector current or ICC current in units of mA, the S21-forward transmission parameter, the S11-input reflection parameter and the S22-output reflection parameter in units of dB. Moreover the noise figure (NF) in units of dB is shown, and the difference (ΔIIP3) of the third order intercept point between the bias circuit without a feedback path and the bias circuit with a feedback path in units of dBm and the difference (ΔP1dB) of the compression point between the bias circuit without a feedback path and the bias circuit with a feedback path in units of dBm, are shown. The measurements were taken for input signals with a frequency of 2140 MHz coupled to the input terminal RFIN of the amplifier. The desired frequency-of-operation for the input signal applied to the amplifier is in this embodiment 2140 MHz. In some embodiments the compression point P1dB and the third order intermodulation point IIP3 are improved for the circuit with the modified biasing scheme according to embodiments of the invention compared to the bias circuit without the bypass-coupling path.

The compression point P1dB illustrates the value of an input amplitude for which the amplitude of the output signal at a fundamental frequency differs by about 1 dB from the idealized linear extrapolation graph of the amplifier. In other words, the P1dB compression point indicates for which input power the gain of the amplifier for a desired signal drops by 1 dB. An ideal amplifier comprises a linear behavior at its output. That means that the output signal is ideally proportional to the input signal. For high input levels, however, the constant of proportionality decreases until the output signal level does not increase any more, even for a further increase of an amplitude of the input signal. The signal input level at which the output signal level differs from an expected value by about 1 dB, compared to a linear behavior, may give the 1 dB compression point (P1dB).

According to the embodiment in FIG. 6 the P1dB compression point can be improved by 3.8 dBm, for an amplifier with a feedback path compared to an amplifier without a bypass feedback path.

The third order intercept point IIP3 may, for example, be improved by 5.7 dBm for the amplifier with the modified biasing scheme caused by the feedback compared to an amplifier without bypass feedback path.

A 10 dB distance between the IIP3 and P1dB may, for example, be achieved if the BJT T2 is considered without an external wiring. In the case of a negative feedback, e.g., an emitter degeneration, the IIP3 may additionally depend on the intermodulation distance IM2. Because of the negative feedback, the IM2 product is coupled to the input of the LNA and heterodyned again with the input signal. Therefore, the IM2 product contributes to the IM3 product. The IM3 products depend additionally on the IM2 products |f1−f2| and |f1+f2|. These IM2 products can be reduced by choosing a source impedance, e.g., an impedance at a control terminal of the transistor T2, which is small compared to the impedance of the amplifier transistor at a frequency of |f1−f2| and |f1+f2|. The source impedance at a frequency of |f1−f2| could be reduced by means of a matching network. As a consequence, a high capacitance (caps) would be required, which would increase the switching time of the amplifier. In addition the source impedance at a frequency of |f1−f2|, for example, for a frequency below a frequency-of-operation range can also be reduced by means of a bias circuit according to embodiments of the invention. Thus, a low switching time of the amplifier can be achieved in some embodiments according to the invention.

An effect of the modified bias circuit according to some embodiments of the invention is the fact that the impedance for a desired frequency-of-operation range may be almost unchanged, for example, by the bypass feedback path 18, and that the impedance for lower frequencies, for example, with a frequency |f1−f2|, for example, below the frequency-of-operation range may be reduced. Therefore, the intermodulation behavior, for example, the IIP3, can be improved without a worsening of the noise figure or the S21-parameter of an amplifier connected to the bias circuit.

The compression behavior may depend on the DC-bias impedance. The smaller the DC-bias impedance, the less it counteracts the input impedance of the bias circuit and the amplification of the low noise amplifier. Therefore, the compression point is increased. If a high input level is applied, the base current of the amplifier transistor, e.g., the low noise amplifier transistor T2 is increased. The bias circuit 10 may supply this additional base current. As a consequence, an additional voltage drop in dependence on the bias impedance may occur, such that the voltage between the base and the emitter VBE2 of the amplifier transistor T2 depends on the bias impedance. The bypass feedback path may reduce such a dependence of the bias point of the amplifier transistor T2.

The bias circuit may optionally comprise an additional inductor, wherein the inductor may be coupled in series with the second impedance element to the feedback node in order to suppress a high frequency signal. Alternatively the inductor may be coupled in series with the feedback impedance element to the bias connection 12 or it may be coupled in series with the parallel element, formed by the second impedance element and the feedback impedance element, to the bias connection. An inductive blocking for high frequencies may be achieved by the inductor. The inductor may result in a blocking of the noise of the bias transistor T1 at high frequencies. For low frequency signals, mainly the resistors Rb1, Rb2 and Rf are effective. In order to achieve a blocking comparable to the described blocking using the feedback path, an inductive coil would be necessary comprising a reactance higher than about 1 kΩ For that purpose an inductive coil would require an inductance of about 100 nH at a frequency of about 2 GHz. This kind of blocking is realized, for example, in the BGA615L7 amplifier. A coil with an inductance of about 100 nH is normally not integrated on a chip, since already a coil with an inductance of about 8 nH consumes a 320×320 µm area on a chip. Such high inductance values may be realized with an external device. In contrast the bias circuit with the feedback may be monolithically integrated on a chip according to embodiments of the invention.

To summarize, the feedback path may eliminate the need to introduce a blocking inductance into the bypass circuit. However, the bias circuit may optionally be supplemented with a blocking impedance, for example, a blocking inductance.

According to embodiments of the invention, it is possible that the input impedance of the bias circuit for a desired frequency-of-operation range may be almost unchanged, compared to a bias circuit without feedback, and the input impedance for lower frequencies reduced, without an increase of the complexity of the bias circuit. The adjusting of the operating point of the current mirror of the bias circuit may be performed in a conventional way since the relation VBE1=VBE2 may be still valid, wherein the voltage between the control terminal and the emitter of the transistor T1 corresponds to VBE1.

Figure 7:
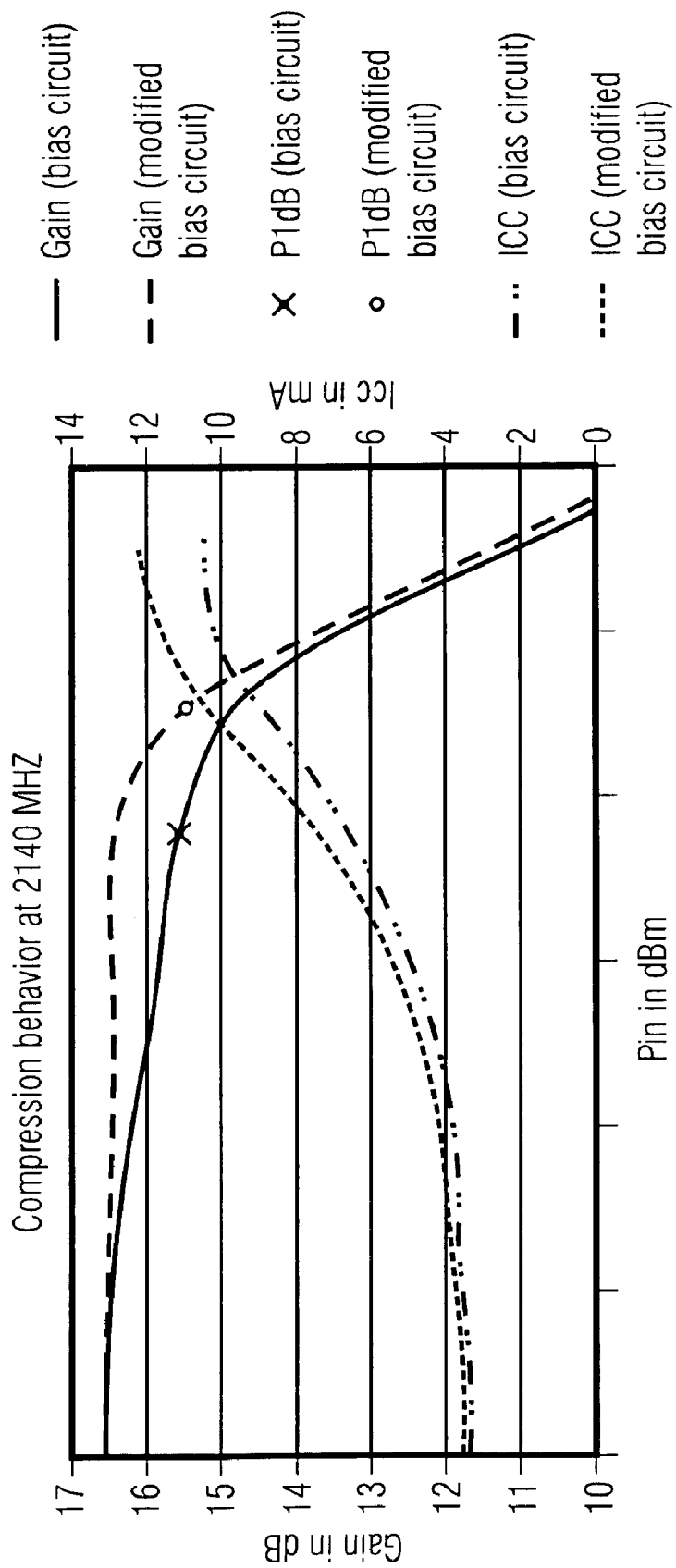
FIG. 7 shows a graphical representation of measured curves on amplifiers comprising the compression behavior and the current consumption of modified bias circuit with feedback path and an amplifier with a bias circuit without a feedback path.

FIG. 7 shows the ICC current, the compression behavior and the gain of an amplifier having a bias circuit without a bypass feedback path in comparison to an amplifier with a modified bias circuit, which is comprising a feedback path. The input power in units of dBm is shown on the X-axis. On the left Y-axis, the gain in dB is depicted, and on the right Y-axis the ICC current in units of mA is depicted. FIG. 7 illustrates the effect of the feedback in the modified bias circuit on the compression behavior of the respective (low noise) amplifier. The P1dB compression point is improved by about 3.8 dBm (ΔP1dB) for the bias circuit with a feedback path compared to the bias circuit without feedback path. Moreover the effect on the ICC current is illustrated. The ICC current may be slightly increased for the amplifier with the modified bias circuit.

FIGS. 8a to 8d show simulation results for bias circuitry with different resistance values for the resistors Rb1 and Rb2 in comparison to a bias circuit with a feedback path according to an embodiment of the invention. The chosen resistance value for Rb1, Rb2 and Rf are only considered as examples without any limitation.

Figure 8A:
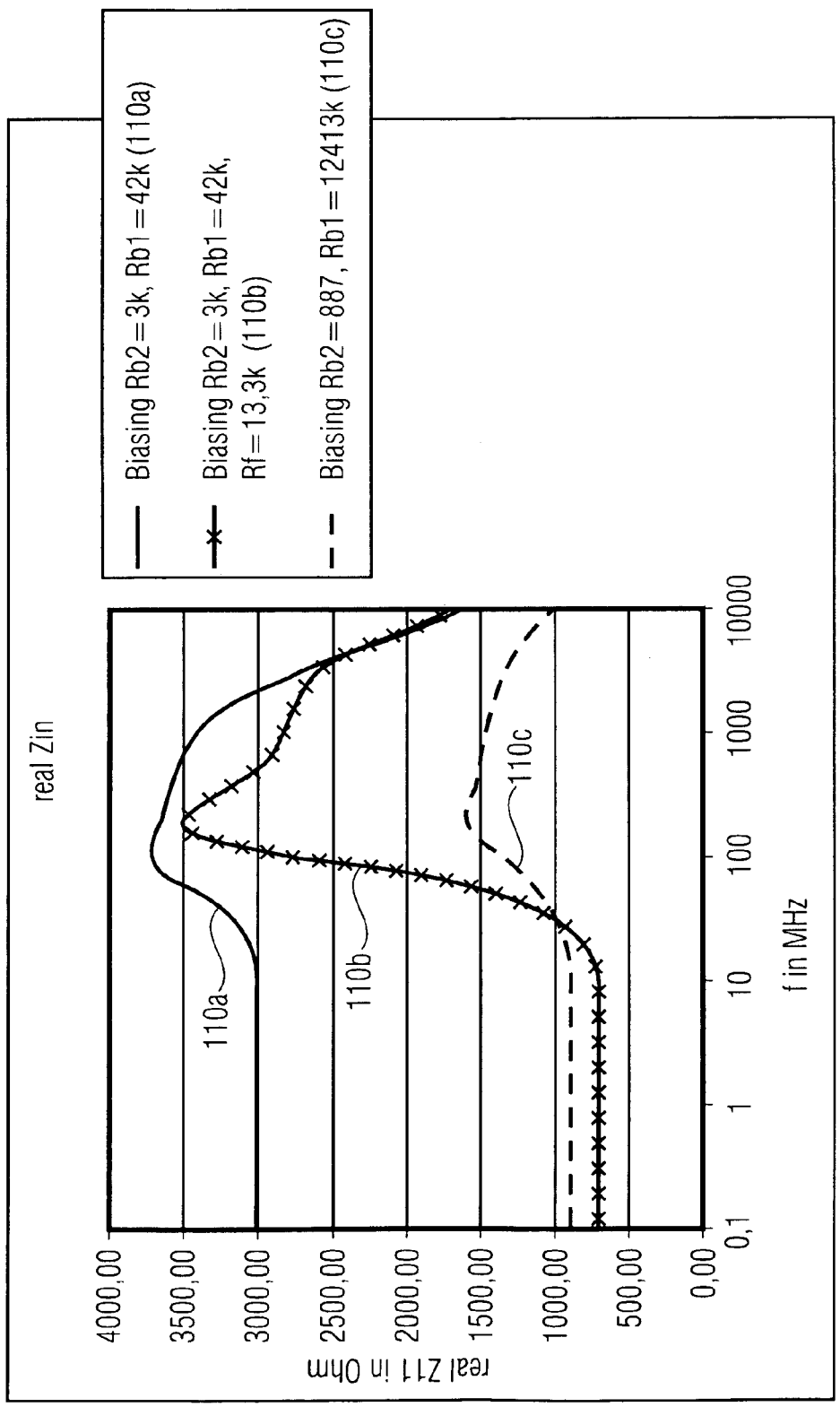
FIGS. 8a to 8d show diagrams representing, the real part, the imaginary part and the phase of the input impedance of the bias circuit depending on varying resistance values for resistors used in the bias circuit.

In FIG. 8a the real part of the input impedance of the bias circuit—the resistance—is depicted. On the logarithmic abscissa the frequency is shown and on the ordinate the real part of the impedance in units of Ohm is shown. The diagram in FIG. 8a comprises several "simulated" curves 110a, 110b and 110c representing simulation results. The curve 110a has been simulated for a bias circuit without a bypass-coupling path. It was simulated for a resistor Rb1 with a resistance of about 42 kΩ and for a resistor Rb2 with a resistance of about 3 kΩ and without the bypass-coupling path. The curve 110b has been simulated with the same resistance values for the resistors Rb1 and Rb2, but with the bypass-coupling path comprising the feedback impedance element Rf with a resistance value of about 13.3 kΩ. In order to make the influence of the resistance values for the resistors Rb1 and Rb2 clear, different resistance values have been chosen for the simulated curve 110c. For this simulation (curve 110c), the resistor Rb1 comprises a resistance of about 12413Ω and the resistor Rb2 comprises a resistance of about 887Ω. The simulation of curve 110c was performed for a bias circuit without the bypass-coupling path.

The input impedance for the bias circuitry without bypass-coupling path is mainly given by the resistance value of the second impedance element Rb2, as can be seen in the corresponding simulated curves 110a, 110b. A desired high input impedance of the bias circuit for high frequencies may be achieved for a bias circuit without bypass-coupling path in the configuration described with reference to curve 110a. However, in this configuration the input impedance for low frequencies is much higher compared to the input impedance of the simulated curves 110b, 110c. The curve 110c, however comprises only a slightly increased input impedance for higher frequencies in a desired frequency-of-operating range.

The simulated curve 110b for the modified bias circuit with a bypass-coupling path combines both, a low input impedance behavior for low frequencies and a high input impedance behavior for high frequencies in a desired frequency-of-operation range.

It should be mentioned here that the resistors Rb1 and Rb2 can be used to set the operating point of the current mirror of the bias circuit. If the current ratio of the current mirror is N, for example, N=14, the resistors Rb1 and Rb2 may be chosen by the formula Rb1=N·Rb2. In this configuration, the resistor Rb2 may serve as a high frequency block. Rb2, or the input impedance of the bias circuit, should be high at the frequency-of-operation, compared to the input impedance of the low noise amplifier transistor. The smaller the input impedance of the bias circuit at the desired frequency-of-operation range, the more high frequency (HF) input signal may be lost, because of the bias circuit. As a consequence, the noise figure of the low noise amplifier may get worse. The high frequency input signal may be the signal to be amplified, which is coupled to the low noise amplifier at an input RFIN of the low noise amplifier.

In FIG. 8a the sum of the resistance values of Rb1 and Rb2 for the curve 110c gives the resistance value of the feedback impedance element Rf for curve 110b (Rb1+Rb2=13.3 kΩ=Rf). Taking into account that for the resistors Rb1 and Rb2 the formula Rb1=N·Rb2 is valid, the resistance value is about 887Ω for Rb2 and about 12413Ω for Rb1. With this prerequisite, the simulated curve 110c shows a strongly reduced input impedance in the high frequency region and, hence, the noise figure (NF) and the S21-parameter, which describes the transmission behavior from the input to the output of the amplifier, are degraded. The noise figure for the modified bias circuit, with a bypass-coupling path is not changed for the worse. The modified bias circuit combines the effect of a low input impedance of the bias circuit for low frequencies, with a high input impedance of the bias circuit for higher frequencies in a desired frequency-of-operation range. Similar results may be achieved by choosing small resistance values for the bias resistors (Rb1, Rb2) and an external coil for HF blocking.

Figure 8B:
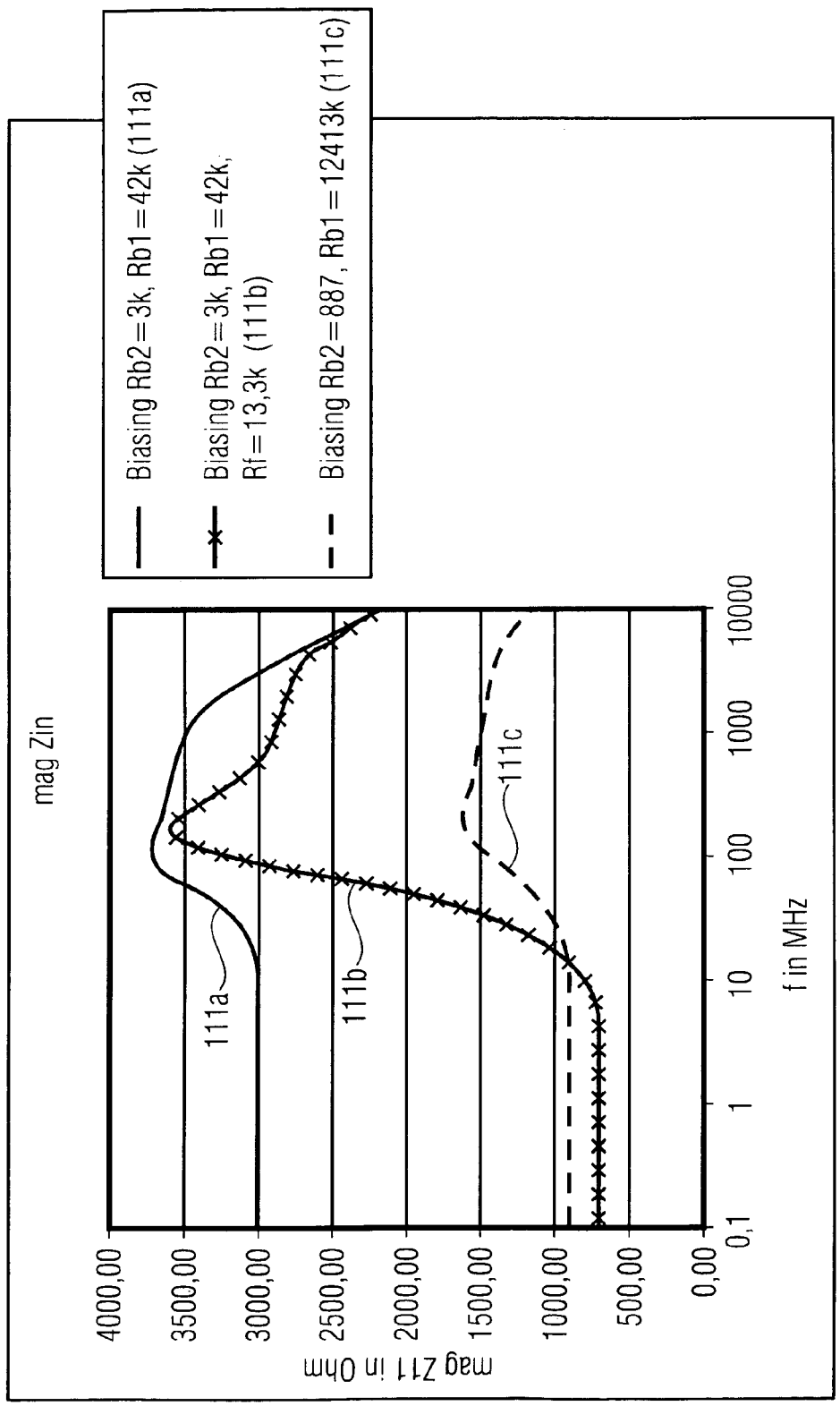

In FIG. 8b, the magnitude of the input impedance of the bias circuitry, which are described with reference to FIG. 5, is depicted. The imaginary component represents the reactance of the bias circuitry. In FIG. 8b, the curve 111a relates, in terms of the respective circuit and the resistance values of the resistors, to the curve 110a, the curve 111b relates to the curve 110b and the curve 111c relates to the curve 110c. The magnitude of the input impedance of the respective bias circuitry behaves, in this simulations, like the respective simulated resistance, represented by the curves 110a, 110b and 110c.

Figure 8C:
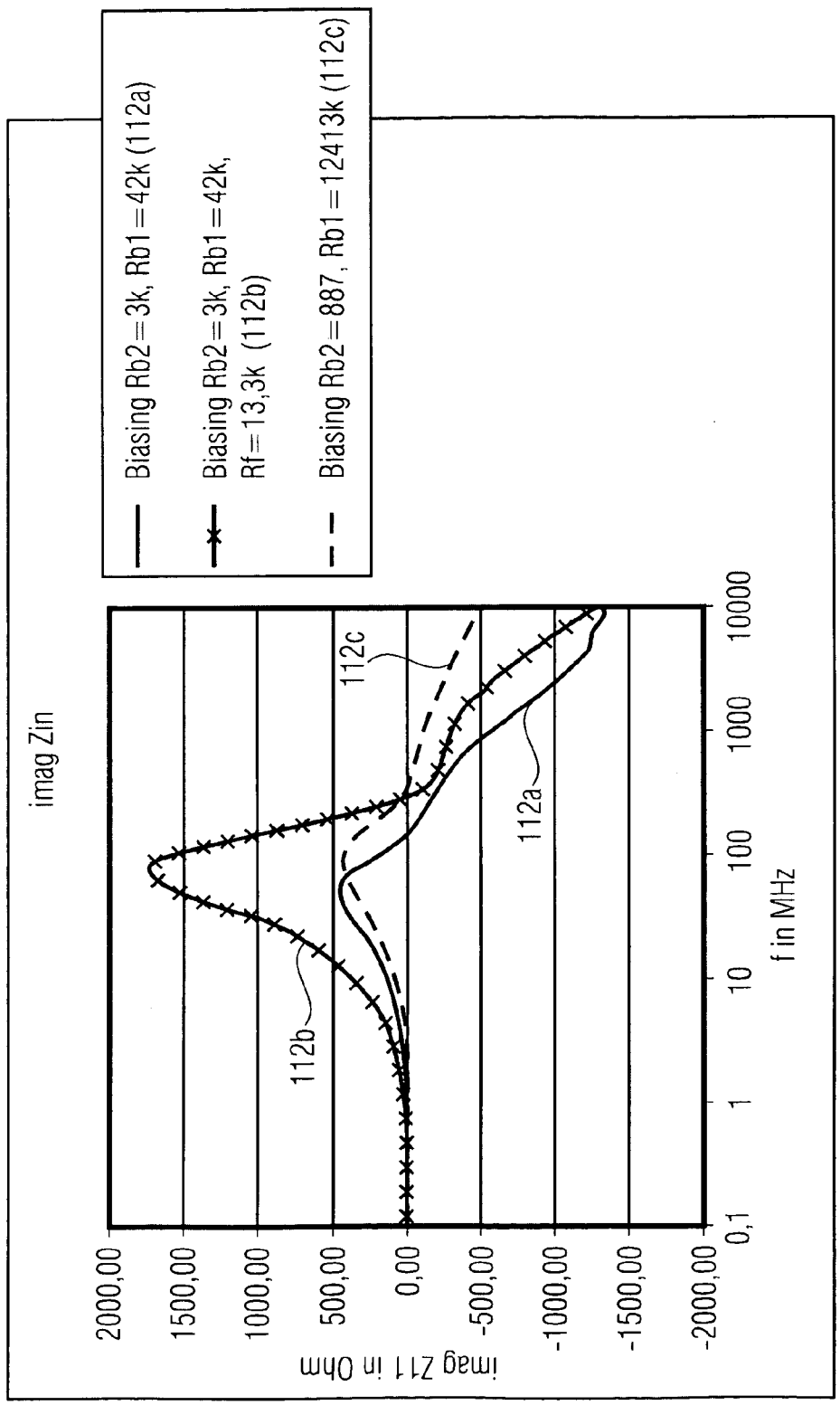

The frequency dependence of the imaginary component of the impedance is depicted in FIG. 8c. The imaginary component represents the reactance of the bias circuitry. The respective curves 112a, 112b and 112c correspond to the bias circuitry with the respective resistors Rb1, Rb2 and Rf, as described with reference to the FIG. 8a.

Figure 8D:
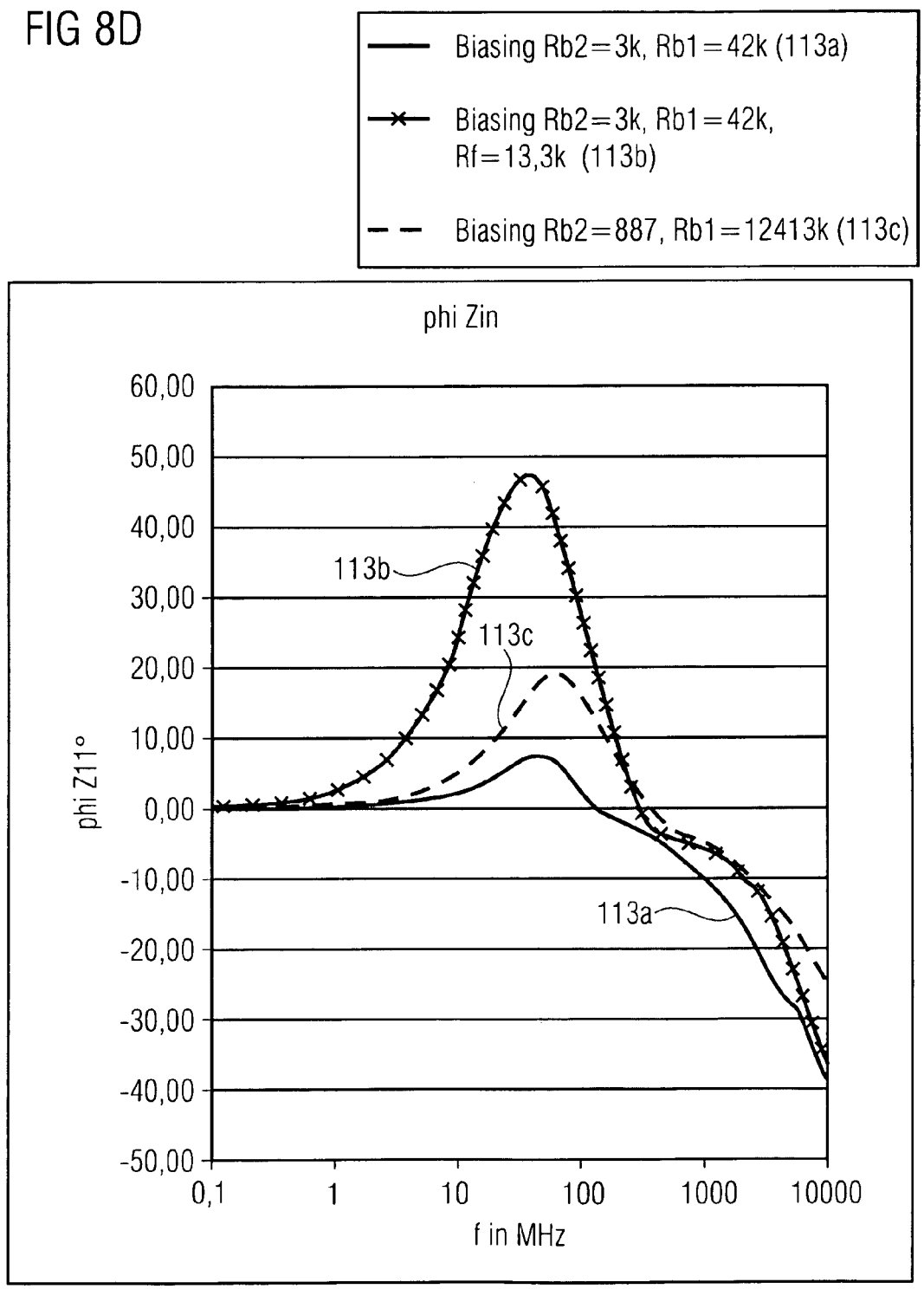

In FIG. 8d, a phase shift angle between the voltage and the current is depicted. On the ordinate, a phase angle is depicted in dependence of an input frequency. The curves 113a, 113b and 113c relate again to the corresponding bias circuitry in FIG. 8a. The modified bias circuit with the bypass-coupling path shows the highest phase shift between an applied voltage and a current compared to the other simulated bias circuitry.

According to embodiments of the invention, a bias circuit with the bypass-coupling path can be monolithically integrated, for example, with an amplifier on one chip. Such an amplifier may comprise an improved intermodulation behavior and an improved compression point compared to a bias circuit without the bypass-coupling path. The amplifier, for example, a low noise amplifier, with a desired compression point, can be realized in current saving way. Furthermore, some embodiments of the invention may offer the possibility to reduce the cost of manufacture by saving an external device, for example, an inductor, a RF-choke or at least one pin. This may be achieved by avoiding the use of an external inductive coil for HF blocking, which is sometimes employed in conventional bias circuitry.

According to embodiments of the invention, an improvement for the usage of integrated low noise amplifiers can be achieved with circuit technology measures. In some embodiments, the bypass-coupling path may result in a feedback path, so that the compression behavior and the intermodulation behavior of an amplifier, which is connected to the bias circuit, is improved. Such a low noise amplifier may be realized as a common emitter circuit or cascode circuit with a current mirror bias circuit with a feedback path.

Typical applications for a bias circuit according to embodiments of the invention are global positioning systems (GPS) applications, mobile phone and wireless applications, as well as applications in the automotive field.

In some embodiments of the invention, the bias circuit may comprise a bias potential regulation loop. The bias potential regulation loop comprises a current mirror transistor and an impedance element. The bias potential regulation loop may comprise a feedback path between the bias connection and the feedback node, via a bypass-coupling path. The bias potential regulation loop may be configured to regulate a potential at a feedback node of the bias circuit. The feedback node of the bias circuit may be coupled to a control terminal of the current mirror transistor via and the impedance element.

According to other embodiments of the invention, the bias circuit comprises a bypass-coupling path, which extends from the bias connection of the bias circuit to the control terminal of the current mirror transistor. The bypass-coupling path may bypass the impedance element. The bias signal, which is provided from the bias circuit at the bias connection of the bias circuit, may depend on the potential at the feedback node.

In another embodiment of the invention, the bias potential regulation loop is configured to reduce an input impedance of the bias circuit, viewed from the bias connection, with a frequency lower than the desired frequency-of-operation range, significantly more than for an input signal with a frequency in a desired frequency-of-operation range.

The desired frequency-of-operation range may be the operation frequency of an amplifier. The desired frequency-of-operation range may be the frequency range for an amplification of an amplifier, e.g., the amplification range of a LNA. It is also possible that the desired frequency-of-operation range corresponds to the frequency range for a linear amplification of an input signal by an amplifier. In some embodiments of the invention the desired frequency-of-operation range may be between about 1 MHz and about 10 GHz, for example, at about 2 GHz. In other embodiments the desired frequency-of-operation range may be different.

Embodiments of the invention comprise an amplifier, which is comprising an amplifying unit with an input terminal to receive a signal to be amplified and a bias signal. The signal to be amplified may be a high frequency signal or a radio frequency signal, which is coupled to the input terminal of the amplifier. Furthermore, the amplifier comprises an output to provide an output signal of the amplifying unit. The output signal is based on the signal to be amplified, which is received at the input of the amplifier. The output signal may be amplified compared to the input signal. Furthermore, the amplifier comprises a bias circuit for providing a biasing signal at the input of the amplifying unit. In other words the amplification of the input signal may also depend on the bias signal from the bias circuit. In embodiments of the invention, the bias circuit may furthermore comprise a bias transistor and a feedback node, wherein the feedback node is coupled to a control terminal of the bias transistor via a first impedance element. The first impedance element may be a resistor. The feedback node is furthermore coupled to the input of the amplifying unit via a second impedance element. The second impedance element can also be a resistor. The control terminal of the bias transistor can be coupled to the bias connection via a bypass-coupling path, which bypasses the first impedance element and the second impedance element, such that there is a feedback path via the bypass-coupling path and via the bias transistor from the bias connection to the feedback node. The bypass-coupling path may comprise a feedback impedance element, which may be a resistor.

According to an embodiment of this invention, such an amplifier described therein can be monolithically integrated on one chip, for example, on a silicon chip or another semiconductor chip. According to a further embodiment of the invention, an amplifier described therein can comprise a feedback node, wherein the feedback is connected to a terminal of a conductive controllable path of the support transistor. The control terminal of the support transistor may be coupled to a terminal of a controllable conductive path of the bias transistor of the bias circuit. The support transistor may be configured to contribute to a coupling between the bias connection and the feedback node. The amplifier described above may furthermore comprise a capacitive element coupled in parallel to the controllable conductive path of the bias transistor of the bias circuit. Due to this, the feedback path between the bias connection and the feedback node may obtain a low pass characteristic, such that a boundary frequency for reducing the input impedance of the bias circuit below a desired operating frequency is given. The capacitive element can be integrated as an additional device in the bias circuit or it can be an intrinsic capacitance formed between the control terminal of the bias transistor and one of its two terminals of the controllable conductive path.

According to some embodiments of the invention, it is possible to reduce a voltage drop of an input signal to be amplified at the first impedance element and at a second impedance element by a feedback in the feedback path of the bias circuit. As a consequence, a voltage between the control terminal of the amplifier transistor of the amplifying unit and a terminal of the controllable conductive path of the amplifier transistor may be stabilized by the feedback.

Figure 9:
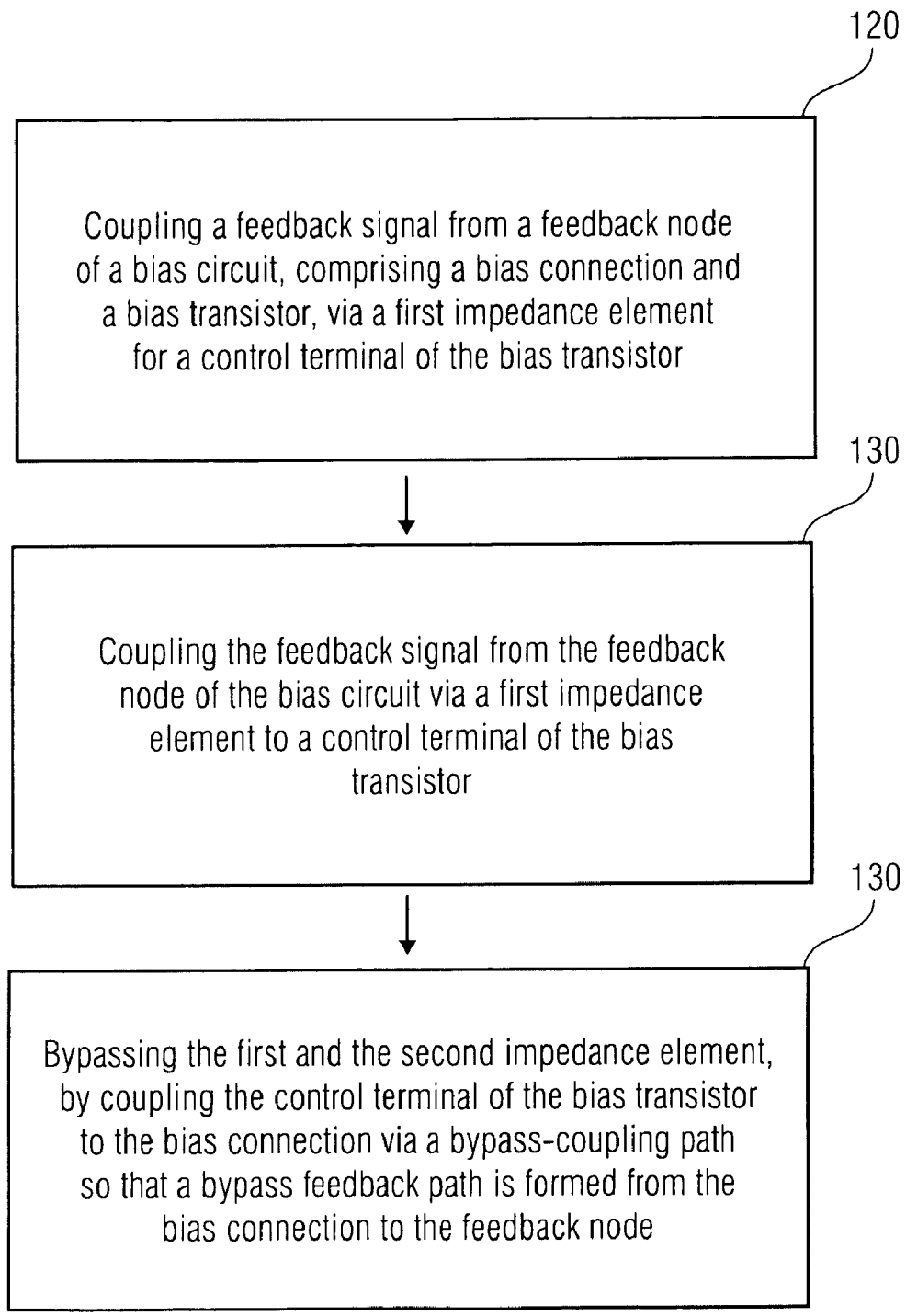
FIG. 9 shows a flow chart of a method for providing a biasing signal at a bias connection of a bias circuit according to an embodiment of the invention.

FIG. 9 shows a flow chart of the method for providing a biasing signal at a bias connection of a bias circuit, comprising a bias transistor and a feedback node. In this embodiment the method comprises a coupling 120 of a feedback signal from the feedback node of the bias circuit via a first impedance element to a control terminal of the bias transistor. Moreover the method comprises a coupling 130 of the feedback signal from the feedback node via a second impedance element to the bias connection and a bypassing 140 the first and the second impedance element, by coupling the control terminal of the bias transistor to the bias connection via a bypass-coupling path so that a bypass feedback path is formed from the bias connection to the feedback node.

Bypassing 140 the first impedance element and the second impedance element via a bypass-coupling path so that a feedback path is formed, can be performed, such that for a given frequency below a desired frequency-of-operation range, a voltage signal at the feedback node, which may be caused by a voltage signal at the bias connection of the bias circuit, is opposite in phase to the voltage signal at the bias connection.

According to other embodiments of the method for providing a biasing signal at a bias connection to a bias circuit, bypassing 140 may be performed so that high frequency signals above a boundary frequency are suppressed by a low pass filter, which is formed by the bias transistor and a parallel coupled capacitive element.

In another embodiment of the invention, the method further comprises a providing of the bias signal to an amplifying unit in order to bias the amplifying unit. The providing of the biasing signal to an amplifying unit can be performed in such a way that an operation point of the amplifying unit is stabilized. The bypassing of the first and the second impedance element can be performed also in such a way that the operating point of the amplifying unit is stabilized.

While this invention has been described in terms of several embodiments, there are alterations, permutations, and equivalents which fall within the scope of this invention. It should be noted that there are many alternative ways of implementing the bias circuit and amplifier of the invention and of performing the method. It is therefore intended that the following appended claims be interpreted as including all such alterations, permutations and equivalents as fall within the true spirit and scope of the invention.

What is claimed is:

1. A bias circuit for providing a biasing signal at a bias connection, the bias circuit comprising:
   a bias transistor; and
   a feedback node;
   wherein the feedback node is coupled to a control terminal of the bias transistor via a first impedance element;
   wherein the feedback node is coupled to the bias connection via a second impedance element; and
   wherein the control terminal of the bias transistor is coupled to the bias connection via a bypass-coupling path, bypassing the first impedance element and the second impedance element, such that there is a feedback path, via the bypass-coupling path and via the bias transistor, from the bias connection to the feedback node.

2. The bias circuit according to claim 1, wherein the bypass-coupling path comprises a feedback impedance element, and wherein the bypass-coupling path is configured such that a coupling via the feedback path is stronger for a low frequency signal than for a high frequency signal.

3. The bias circuit according to claim 1, wherein the feedback path is configured such that an input impedance of the bias circuit, viewed from the bias connection, is at least by a factor of two higher at a desired frequency-of-operation range than in a frequency range lower than the desired frequency-of-operation range.

4. The bias circuit according to claim 3, wherein the bias circuit is configured such that the input impedance differs from an impedance value of the second impedance element by less than 30% at the desired frequency-of-operation range, and such that the input impedance is at least 50% lower than the impedance value of the second impedance element, at a frequency range lower than the desired frequency-of-operation range.

5. The bias circuit according to claim 1, wherein the bypass-coupling path comprises a feedback impedance element and wherein the impedance value of the feedback impedance element coupled between the bias connection and a control terminal of the bias transistor is at least two times higher than the impedance value of the second impedance element.

6. The bias circuit according to claim 1, wherein an impedance value of the first impedance element is at least 1.5 times higher than an impedance value of the second impedance element.

7. The bias circuit according to claim 1, wherein the control terminal of the bias transistor is coupled to the bias connection via the bypass-coupling path, such that, for a given frequency below a desired frequency-of-operation range a voltage signal at the feedback node, which is caused by a voltage signal at the bias connection, is opposite in phase to the voltage signal at the bias connection.

8. The bias circuit according to claim 1, wherein the bias circuit comprises a support transistor;
   wherein the feedback node is connected to a terminal of a controllable conductive path of the support transistor;
   wherein a control terminal of the support transistor is connected with a terminal of a controllable conductive path of the bias transistor; and
   wherein the support transistor is configured to contribute to a coupling between the bias connection and the feedback node.

9. The bias circuit according to claim 1, wherein the bias connection is coupled to an input of an amplifying unit, to provide the bias signal to the amplifying unit, in order to bias the amplifying unit; and
   wherein the amplifying unit is configured to provide an amplified output signal based on an input signal.

10. The bias circuit according to claim 1, wherein the bias circuit comprises a capacitive element coupled in parallel to a controllable conductive path of the bias transistor, to obtain a low pass characteristic of the feedback path in order to set a boundary frequency for reducing the input impedance of the bias circuit below a desired frequency-of operation range.

11. The bias circuit according to claim 1, wherein the feedback path of the bias circuit comprises a low pass filter, configured to determine a boundary frequency for reducing the input impedance of the bias circuit below a desired frequency-of-operation range.

12. The bias circuit according to claim 1, wherein the bias circuit is configured to provide, in a frequency dependent way, a reduction of an effective impedance of the second impedance element, when compared to an actual impedance of the second impedance element.

13. The bias circuit according to claim 1, wherein the bias circuit is configured to provide, in a frequency selective way, a negative feedback signal to the feedback node in response to a signal at the bias connection, to reduce an effective impedance of the second impedance element for a given frequency range.

14. The bias circuit according to claim 1, wherein the bias circuit is configured to regulate a potential at the feedback node in dependence on a current provided by a current source, such that at least 90% of the current provided by a current source flow through the controllable conductive path of the bias transistor.

15. The bias circuit according to claim 1, wherein the bias circuit is configured to form in combination with a transistor coupled to the bias connection, a current mirror.

16. A bias circuit for providing a bias signal at a bias connection, the bias circuit comprising:
   a bias potential regulation loop comprising a current mirror transistor and an impedance element,
   wherein the bias potential regulation loop is configured to regulate a potential at a feedback node in response to a reference current, and
   wherein the feedback node is coupled to a control terminal of the current mirror transistor via the impedance element; and
   a bypass-coupling path, extending from the bias connection to the control terminal of the current mirror transistor, bypassing the impedance element and the feedback node; and
   wherein the bias signal is dependent on the potential at the feedback node.

17. The bias circuit according to claim 16, wherein the bias circuit is configured such that there is a coupling between the bias connection and the feedback node via the bypass-coupling path and via the current mirror transistor, and wherein the coupling between the bias connection and the feedback node is such that a voltage increase at the bias connection effects a voltage decrease at the feedback node; and
   wherein the bias potential regulation loop is configured to reduce an input impedance of the bias circuit, viewed from the bias connection, with a frequency lower than a desired frequency-of-operation range significantly more than for an input signal with a frequency in the desired frequency-of-operation range.

18. An amplifier comprising:
   an amplifying unit comprising an input to receive a signal to be amplified and a biasing signal, and an output to provide an output signal of the amplifying unit, based on the signal to be amplified; and
   a bias circuit for providing the biasing signal at the input of the amplifying unit;
   wherein the bias circuit comprises a bias transistor and a feedback node;
   wherein the feedback node is coupled to a control terminal of the bias transistor via a first impedance element;
   wherein the feedback node is coupled to the input of the amplifying unit via a second impedance element;
   wherein the control terminal of the bias transistor is coupled to the input of the amplifying unit via a bypass-coupling path, bypassing the first impedance element and the second impedance element, such that there is a feedback path via the bypass-coupling path and via the bias transistor, from the input of the amplifying unit to the feedback node, and
   wherein the bypass-coupling path comprises a feedback impedance element.

19. The amplifier according to claim 18, wherein the bias circuit comprises a support transistor,
   wherein the feedback node is connected to a terminal of a controllable conductive path of the support transistor,
   wherein a control terminal of the support transistor is connected with a terminal of a controllable conductive path of the bias transistor; and
   wherein the support transistor is configured to contribute to a coupling between the bias connection and the feedback node.

20. The amplifier according to claim 18, wherein the amplifying unit comprises an amplifier transistor,
   wherein the input of the amplifying unit is formed by a control terminal of the amplifier transistor; and
   wherein the control terminal of the amplifier transistor is coupled to the bias transistor, such that the bias transistor and the amplifier transistor form a current mirror.

21. The amplifier according to claim 18, wherein the bias circuit is configured to bias the amplifier transistor, such that an operation point of the amplifier transistor is given; and
   wherein the bias circuit is configured to stabilize the operating point of the amplifier transistor by a feedback in the feedback path of the bias circuit.

22. The amplifier according to claim 21, wherein the bias circuit is configured to reduce a DC bias impedance of the bias circuit viewed from the bias connection by the feedback in the feedback path of the bias circuit, so that a compression point of the amplifier transistor is increased.

23. The amplifier according to claim 20, wherein the bias circuit is configured to stabilize a voltage between the control terminal of the amplifier transistor and a terminal of the controllable conductive path of the amplifier transistor using the bypass-coupling path.

24. An amplifier for providing an output signal based on an input signal, the amplifier comprising:
   an amplifier transistor, wherein the control terminal of the amplifier transistor is coupled to a signal input for a signal to be amplified,
   wherein a first terminal of a controllable conductive path of the amplifier transistor is coupled to a reference potential feed,
   wherein a second terminal of the controllable conductive path of the amplifier transistor is coupled, via an output circuit, to an output signal terminal for the output signal;
   a bias circuit for providing a biasing signal at the control terminal of the amplifier transistor, wherein the bias circuit comprises a bias transistor and a feedback node;
   wherein the feedback node is coupled to a control terminal of the bias transistor via a first impedance element;
   wherein the feedback node is coupled to the control terminal of the amplifier transistor via a second impedance element;
   wherein the control terminal of the bias transistor is coupled to the control terminal of the amplifier transistor via a bypass-coupling path, bypassing the first impedance element and the second impedance element, such that there is a feedback path, via the bypass-coupling path and via the bias transistor, from the control terminal of the amplifier transistor to the feedback node;
   wherein a first terminal of the controllable conductive path of the bias transistor is coupled to a control terminal of a support transistor, and wherein a second terminal of controllable conductive path of the bias transistor is connected to the reference potential feed;
   wherein a capacitive element is coupled in parallel between the first terminal and the second terminal of the bias transistor;
   wherein a controllable conductive path of the support transistor is coupled between the supply potential feed and the feedback node; and
   wherein a current source is connected to the supply potential feed and to a node via which the control terminal of the support transistor and a first terminal of the controllable conductive path of the bias transistor are connected.

25. A method for providing a biasing signal at a bias connection of a bias circuit, comprising a bias transistor, a feedback node, the method comprising:

coupling a feedback signal from the feedback node of the bias circuit via a first impedance element to a control terminal of the bias transistor;

coupling the feedback signal from the feedback node via a second impedance element to the bias connection; and bypassing the first and the second impedance element, by coupling the control terminal of the bias transistor to the bias connection via a bypass-coupling path so that a bypass feedback path is formed from the bias connection to the feedback node.

* * * * *